United States Patent [19]

Kunugi

[11] Patent Number: 4,637,049
[45] Date of Patent: Jan. 13, 1987

[54] CAR-MOUNTED AUDIO SYSTEM
[75] Inventor: Yoshiro Kunugi, Saitama, Japan
[73] Assignee: Pioneer Electronic Corporation, Tokyo, Japan
[21] Appl. No.: 721,704
[22] Filed: Apr. 10, 1985
[30] Foreign Application Priority Data Apr. 11, 1984 [JP] Japan ............................ 59-53933[U]

[51] Int. Cl.⁴ .............................................. H04Q 5/00
[52] U.S. Cl. ........................................ 381/86; 381/123
[58] Field of Search ......................... 381/86, 123, 119; 455/95, 99, 345

[56] References Cited

U.S. PATENT DOCUMENTS

| | | | |
|---|---|---|---|
| 2,908,766 | 10/1959 | Taylor | 381/86 |
| 3,882,275 | 5/1975 | Carroll | 381/86 |
| 4,090,033 | 5/1978 | Silverstein | 381/86 |
| 4,176,251 | 11/1979 | Odlen | 381/123 |
| 4,347,510 | 8/1982 | Ishigaki | 381/123 |
| 4,389,541 | 6/1983 | Nakano | 381/86 |
| 4,506,377 | 3/1985 | Kishi | 381/86 |
| 4,525,820 | 6/1985 | Enoki | 381/123 |

FOREIGN PATENT DOCUMENTS

| | | | |
|---|---|---|---|
| 2021214 | 11/1971 | Fed. Rep. of Germany | 381/86 |
| 2032229 | 4/1980 | United Kingdom | 381/86 |

Primary Examiner—Gene Z. Rubinson
Assistant Examiner—L. C. Schroeder
Attorney, Agent, or Firm—Finnegan, Henderson, Farabow, Garrett & Dunner

[57] ABSTRACT

There is provided in a car-mounted audio system an operator control section, a display section and a mechanical deck section in a central console or dashboard unit, wherein other units are located in hideaway positions, the system being characterized in that, a built-in microphone and a microphone amplifier are provided at the central control apparatus, buffers are provided at the hideaway units, and a microphone signal bus line is incorporated in the signal line connection between the central control and the hideaway units to couple a common microphone output signal therebetween.

4 Claims, 3 Drawing Figures

CAR-MOUNTED AUDIO SYSTEM

FIELD OF THE INVENTION

The present invention relates to car-mounted audio equipment wherein operator controls, display means, and mechanical drive components are provided in a central console or in a dashboard unit and other parts of the system are provided in more remote, hidden-away locations.

BACKGROUND

The system shown in FIG. 1 is an example of the above-mentioned type of audio equipment. In this prior art equipment, the parts which an operator needs for operation of the system i.e., the operator controls such as knobs and buttons, the display section for displaying operational states, and the drive deck (the mechanical components), are provided in a console unit or in the dashboard, and the other parts are provided in hidden-away locations as much as possible. This arrangement provides the freedom of combining each of the units with other units and it is contemplated that various different types of components, e.g., personal radio communication devices, compact disk units and so, can be combined to expand the system as desired.

In FIG. 1, the components shown in double-line enclosures are provided in the console or dashboard unit, which comprises operator control section 16, display section 17, and a deck section 18. The parts shown in single-line enclosures are provided in hideaway locations. The latter include a tuner unit 19, a preamplifier unit 23, a unit 24 for singing an air to the tune of a melody recorded on a recording medium such as magnetic tape (hereinafter referred to as "the karaoke unit" or "the karaoke apparatus"), a graphic equalizer unit 25, an ASL unit 26 (an apparatus to control the volume automatically), and a power amplifier unit 27. These components comprise the audio signal processing portion of the system.

The units are connected to one another by a connecting cable 20. The cable 20 is composed of a microcomputer bus line 21 and a two-core shielding connection line 22 which comprises an L & R channel line and a grand line. Microcomputer 1 and a plurality of microcomputers 2 are respectively connected via the microcomputer bus line 21, wherein the microcomputer 1 works as a master source and each microcomputer 2 works as a terminal satisfying its unit specification.

Each of the microcomputers 1 and 2 are connected with the circuits 4 to 11 within the units 16–26. When the circuits 4, 5 of the operator control section and the display section do not have any signal sources, then they would not be connected with the audio bus line 22.

A microphone 12 for the karaoke apparatus is connected with the circuits 9 of the karaoke unit 24. A microphone 13 for detecting the pink noise is connected with the circuit 10 of the graphic equalizer 25. Further, a microphone 14 for detecting the running noise is connected with the circuit 11 of the ASL unit 26. In addition, speakers 15 for the L & R channel are connected with the power amplifier units 27.

When the operator manipulates the operator controls in this prior art audio equipment, each unit is controlled by the microcomputer 1 and a result of the control state is displayed on the display 17.

Suppose that the deck section 18 starts in operation. The audio signal from the circuit 6 is fed to the audio source bus line 22 shown by the dotted line in FIG. 1 and is fed to the circuit 8 of the preamplifier unit 23, wherein signal processing to effect volume control and tone control is performed. The processed signal is fed to the audio signal line 28, which is connected with the power source. Therefore, conventional audio processing is done toward said signal so that finally the speaker 15 is driven through the power amplifier 27.

In the case of the karaoke operation, the audio signal is detected through the microphone 12 connected with the circuit 9 of the karaoke unit 24. This detected signal is subjected to echo processing and mixing and fed to the audio signal line 28. The microphone 13 connected with the graphic equalizer 25 is used for controlling the automatic frequency characteristic and detects the pink noise transmitted inside the car. That is to say, the pink noise originated at the circuit 10 is amplified through the power amplifier and put on the air over the speaker 15 in the car. Owing to the fact that the microphone 13 then detects the sounded pink noise, the circuit 10 discriminates the level at each frequency processed by the graphic equalizer and controls the equalizer so as to produce a flat frequency characteristic. Since the microphone 14 of the ASL unit 26 detects the running noise inside the car, the circuit 11 controls the volume and the tone, etc., on the base of the noise for compensating the Masking Phenomenon which is brought by the running noise.

FIG. 2 shows the block diagram of the audio signal system of the prior art. The audio outputs of the sources, i.e., the deck section, the tuner unit and other source units, are connected to the audio source bus line as the current source through a voltage-current conversion circuit 29. The signal currents from the plural sources are fed to a current-voltage conversion circuit 30 of the preamplifier 23 to convert the currents into voltage, which are fed to another audio unit through the volume tone circuit 31.

Since the car-mounted audio equipment of the prior art is configured as mentioned above, separate microphones have to be provided for the karaoke unit 24, the graphic equalizer unit 25, and the ASL unit 26.

OBJECT OF THE PRESENT INVENTION

The present invention provides a car-mounted audio system which can employ a common microphone by providing a built-in microphone in the console unit and by providing a microphone signal bus line in the connection cable for supplying the microphone signal to the various units through appropriate buffer amplifier circuits.

SUMMARY OF THE INVENTION

In order to accomplish the object of the present invention, there is provided an operator control section, a display section and a mechanical deck section in a central console or dashboard unit, wherein other units are located in hideaway positions, the system being characterized in that, a built-in microphone and a microphone amplifier are provided at the central control apparatus, buffers are provided at the hideaway units, and a microphone signal bus line is incorporated in the signal line connection between the central control apparatus and the hideaway units to couple a common microphone output signal therebetween.

BRIEF DESCRIPTION OF THE DRAWINGS

The accompanying drawings which are incorporated in and constitute a part of this specification, illustrate a preferred embodiment of the invention and together with the description, serve to explain the principles of the invention. In the drawings.

DESCRIPTION OF PREFERRED EMBODIMENT

Figure 1:
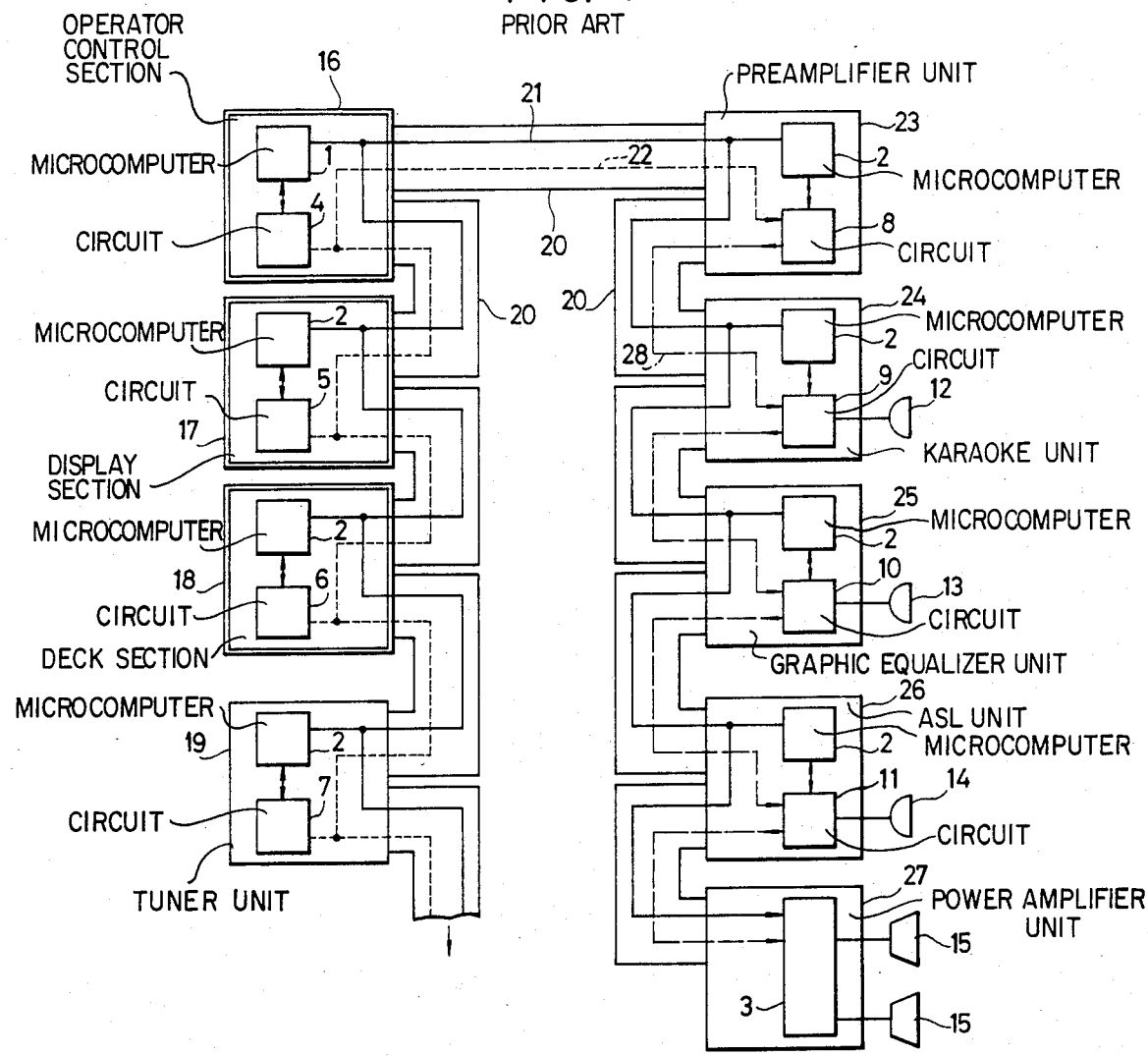
FIG. 1 is a schematic block diagram showing an example of the prior art.
Figure 2:
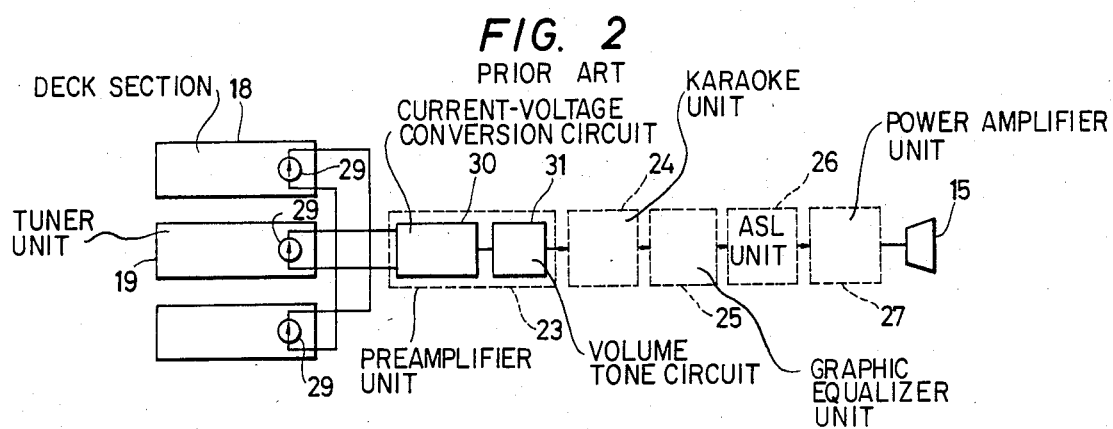
FIG. 2 is a system block diagram of the audio signal equipment of the prior art.
Figure 3:
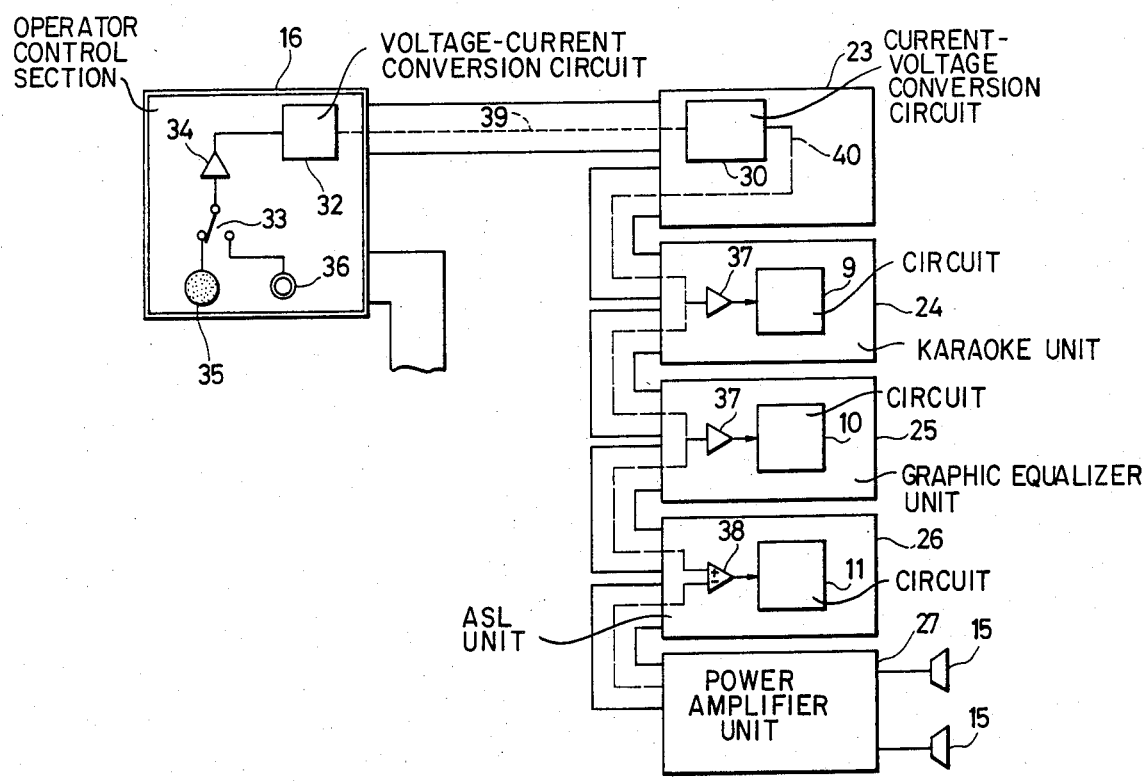
FIG. 3 is a schematic block diagram of an embodiment according to the present invention.

Hereinafter a preferred embodiment according to the invention is described in detail by referring to FIG. 3. In this description, reference numbers are used to identify elements common to those identified in FIG. 1 with the same numbers and further description of such elements is omitted herein. The microphones 12, 13 and 14 of FIG. 1 are eliminated and replaced by a built-in microphone 35 provided at the central control console. Buffer amplifiers 37 and 38 are provided in units 24, 25 and 27 and are connected to a microphone signal bus line 39/40. The built-in microphone 35 is connected with a microphone amplifier 34 through a switch 33. A microphone jack 36 connected in parallel with the microphone 35 is adapted to be selectively switched by the switch 33 to connect an exterior microphone into the system. The output of the microphone amplifier 34 is supplied to a voltage-current (V/I) conversion circuit 32 which applies the microphone output to the microphone signal bus line 39. A circuit 30 for making current-voltage (I/V) conversion is provided at the input of preamplifier unit 23 so that the microphone output is converted to a voltage signal for application to the buffer amplifiers 37 and 38 in units 24, 25 and 26.

In this embodiment the running noise in the car, the audio signal and the pink noise, etc., are detected by the built-in microphone or the external microphone connected through jack 36 to be amplified through the microphone amplifier 34.

The amplified signal is converted to a current signal by V/I conversion circuit 32 for transmission on the microphone signal bus line 39 whereupon the signal is converted back to the voltage form by I/V conversion circuit 30 in the preamplifier unit 23. The voltage signal is then fed to microphone signal line 40 to be supplied to the audio units.

In the karaoke unit 24, the signal is fed to the circuit 9 through the buffer amplifier 37 connected with the microphone signal line, wherein the karaoke unit processes the audio signal at necessary times and sends it to the audio signal line 28 (not shown). The pink noise is fed to the circuit 10 of the unit 25 through the buffer amplifier 37 for detecting the frequency characteristics of the graphic equalizer unit 25.

Further, the running noise signal is fed to the circuit 11 through the buffer amplifier 38 having two input terminals, i.e., a positive-phase terminal and a reverse-phase terminal in the ASL unit 26. Hence, when the running noise signal is fed at the positive phase terminal of the amplifier 38, a signal is also fed at the reverse phase terminal of the amplifier 38 from an amplifier which is not shown in FIG. 3, so that erroneous operation is prevented. Owing to this arrangement, the signal detected by one microphone is used in common by plural units coupled through buffer amplifiers.

In the above-described embodiment, the built-in microphone 35 is located at the operator control section. However, such microphone can be located within other portions of the central console unit. Furthermore, while in the embodiment, the shielding wire for the microphone signal bus line 39 and the microphone signal line 40 are included in the connection cable, such lines may be included in the audio source bus line 22 or in the audio signal line 28. A three-core shielding wire including said lines, the L & R channel line and the microphone signal line may be also used.

In summary, as described in detail hereinabove, this invention provides a common microphone and audio signal bus line, along with buffer amplifiers to provide a common microphone whereby the system is substantially simplified and can be constructed at a reduced cost.

What is claimed is:

1. A car-mounted audio system comprising:
 a central control console including an operator control section, a display section and a mechanical drive section;
 a plurality of audio signal processing units at separate locations connected to said central control console,
 a single microphone and a single microphone amplifier mounted at said central control console said microphone adapted to detect running noise, pink noise and an audio signal and generating an output signal in response to such detection;
 buffer amplifier means provided at each of said audio signal processing units for buffering signals received from said central control console; and
 microphone signal bus means interconnecting said microphone amplifier at said central control console to said buffer amplifier means for supplying said output signal from said microphone in common to said plurality of audio signal processing units.

2. The car-mounted audio system of claim 1 wherein said microphone signal bus means includes a two-wire shielded cable.

3. The car-mounted audio system of claim 1 wherein a microphone jack is provided in parallel with said microphone and is connected to exterior microphone means.

4. The car-mounted audio system of claim 1 wherein said microphone signal bus means includes:
 voltage-currect conversion means provided at said central console for converting a voltage signal at the output of said microphone amplifier to a current signal, and
 current-voltage conversion means provided at one of said audio signal processing units for converting said current signal back to a voltage signal.

* * * * *